United States Patent
Li et al.

(10) Patent No.: US 9,368,592 B2
(45) Date of Patent: Jun. 14, 2016

(54) METAL GATE STRUCTURE

(71) Applicant: TAIWAN SEMICONDUCTOR MANUFACTURING COMPANY LTD., Hsinchu (TW)

(72) Inventors: Yi-Fang Li, Changhua County (TW); Chun-Sheng Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 39 days.

(21) Appl. No.: 14/166,283

(22) Filed: Jan. 28, 2014

(65) Prior Publication Data

US 2015/0214319 A1  Jul. 30, 2015

(51) Int. Cl.
   *H01L 27/148* (2006.01)
   *H01L 29/768* (2006.01)
   *H01L 29/49* (2006.01)
   *H01L 29/66* (2006.01)
   *H01L 29/51* (2006.01)

(52) U.S. Cl.
   CPC ...... *H01L 29/4966* (2013.01); *H01L 29/66545* (2013.01); *H01L 29/66606* (2013.01); *H01L 29/51* (2013.01); *H01L 29/66636* (2013.01)

(58) Field of Classification Search
   CPC .......................... H01L 29/495; H01L 29/768
   USPC .................................. 438/297; 257/250, 296
   See application file for complete search history.

(56) References Cited

U.S. PATENT DOCUMENTS

| | | | | |
|---|---|---|---|---|
| 2006/0202237 A1* | 9/2006 | Huang | ............. | H01L 21/28097 257/250 |
| 2008/0073733 A1* | 3/2008 | Kudo | ................ | H01L 21/28097 257/412 |
| 2008/0085576 A1* | 4/2008 | Lee | ................... | H01L 21/28052 438/197 |

OTHER PUBLICATIONS

The official action and the search report of No. 103114347 issued by Taiwan Property Intellectual Office at Dec. 29, 2015.

* cited by examiner

*Primary Examiner* — Phuc Dang
(74) *Attorney, Agent, or Firm* — Chun-Ming Shih

(57) ABSTRACT

The present disclosure provides a semiconductor structure, including a substrate, a metal gate, a dielectric layer, and an etch stop layer. The metal gate is positioned on the substrate and possesses a first surface. The dielectric layer surrounds the metal gate and possesses a second surface. The etch stop layer is in contact with both the first surface and the second surface. The first surface is higher than the second surface. The present disclosure also provides a method for manufacturing a semiconductor structure, including forming a dummy gate on a substrate; forming a second etch stop layer over the dummy gate; forming a dielectric layer over the dummy gate; replacing the dummy gate with a metal gate; etching back the dielectric layer to form a second surface of the dielectric layer lower than a first surface of the metal gate; and forming a first etch stop layer over the metal gate and the dielectric layer.

20 Claims, 15 Drawing Sheets

METAL GATE STRUCTURE

BACKGROUND

In today's rapidly advancing world of semiconductor manufacturing, integration levels are increasing, device features are becoming smaller and greater demands are being made for improved device performance. As CMOS, complementary metal oxide semiconductor, devices are scaled to smaller sizes for future technologies, new materials and concepts are necessary to meet the advanced performance requirements.

CMOS technology includes NMOS (N-type metal oxide semiconductor) and PMOS (P-type metal oxide semiconductor) devices formed on the same substrate and in the same die. A critical aspect of high performance in NMOS and PMOS and various other devices is device speed. For devices to operate at high speeds, it is necessary to have a very low resistance, including a very low contact resistance between metal interconnect structures and the NMOS and PMOS transistors. Contact is made to the gate electrodes of the respective transistors as well as to both the source and drain regions of the associated transistors. One approach to provide contacts to both the source and drain regions is to form trenches penetrating through the dielectric layers above the source and drain regions and then fill the trenches with conductive materials.

During the scaling trend, various materials have been used for the gate electrode and gate dielectric for CMOS devices. One approach is to fabricate these devices with a metal material for the gate electrode and a high-k dielectric for the gate dielectric. However, high-k metal gate (HKMG) devices often require additional layers in the gate structure. For example, work function layers may be used to tune the work function values of the metal gates. Additionally, barrier (or capping) layers may assist in the HKMG manufacturing process. Although the combination of source/drain contact and HKMG formation have been satisfactory for their intended purpose, they have not been satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
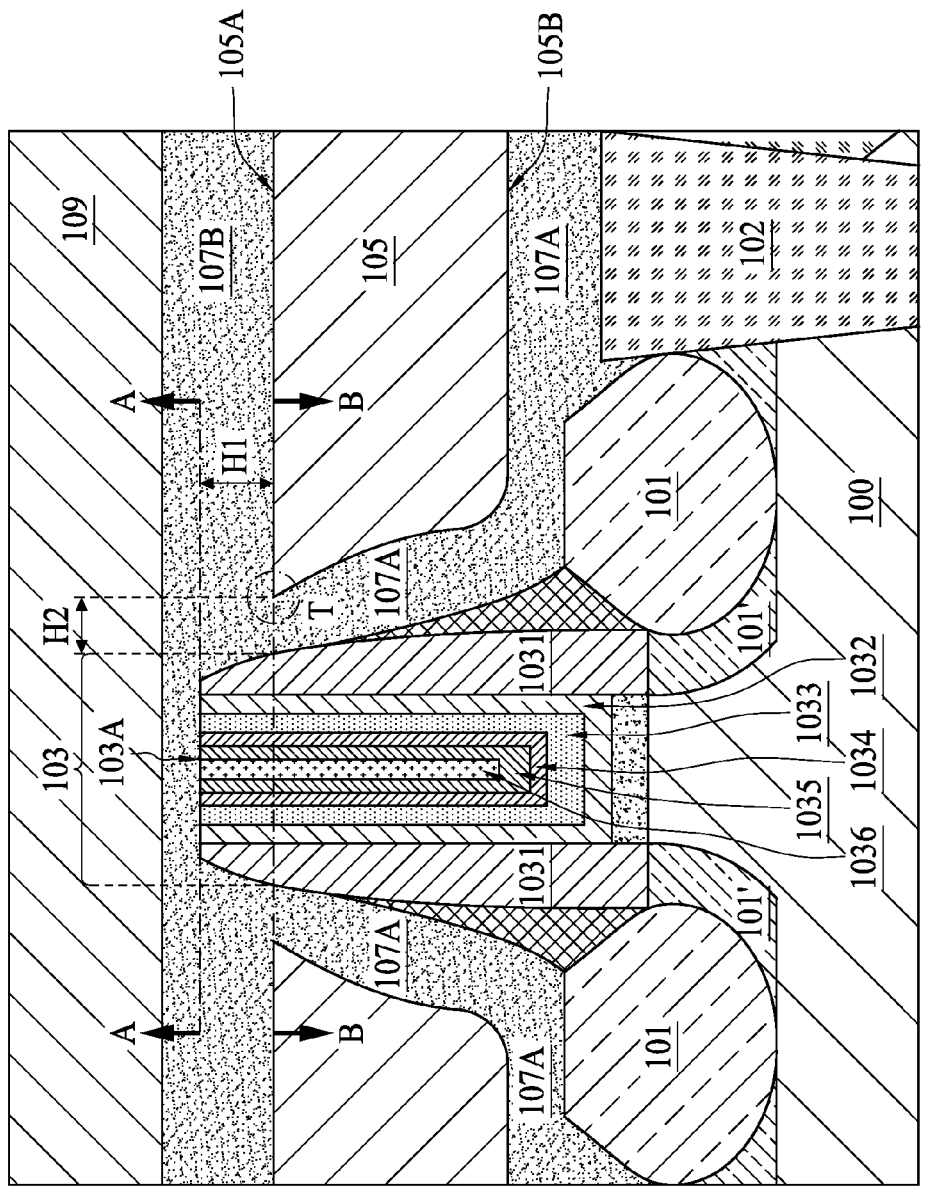
FIG. 1 is a cross sectional view of a metal gate structure without a source/drain contact, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the size of the device scales down, several manufacturing operations exploited in the larger scale device show significant problems in the reduced scale. For example, the formation of a source/drain contact in a metal gate transistor having a channel length of about 20 nm or less shows an emptied metal gate in accordance to the custom operations. The formation of a source/drain region contact in a metal gate transistor usually includes the following steps: (i) forming a bottom etch stop layer of a metal gate; (ii) forming a interlayer dielectric (ILD) over the bottom etch stop layer; (iii) planarizing the ILD and the bottom etch stop layer until a top surface of the metal gate is exposed; (iv) forming a top etch stop layer over the top surface of the metal gate; (v) forming source/drain region contact hole by introducing etchants that removes the ILD and both the bottom and the top etch stop layer.

According to the operation described above, an interface situated between the ILD and the top etch stop layer affects as a leakage path allowing the etchants to penetrate through until reaching the metal layers of the metal gate while forming the source/drain contact hole. When the suitable etchants used to form the source/drain contact hole has a finite etch rate to the metal layers of the metal gate, the leakage path provides a channel for the metal layers to be etched and emptied. For example, a filling metal layer (e.g. a tungsten layer) of the metal gate is completely removed using the operation described above. For another example, a filling metal layer (e.g. a tungsten layer), a work function metal layer (e.g. an aluminum-containing nitride layer), a barrier layer (e.g. a nitride layer), and a capping layer (e.g. a nitride layer) are all removed and emptied in accordance to the operation described above. Either the partial or the complete removal of the metal gate lowers the yield and/or reliability of the device, and thus the removal/emptying phenomena of the metal gate after source/drain contact hole formation shall be prevented.

Given the above problems faced by the sub-20 nm metal gate transistor structure, a semiconductor structure with a cutoff leakage path is provided in the present disclosure. The interface between the etch stop layer and the ILD is tailored to end at a predetermined distance away from the metal layers of the metal gate, and hence the leakage path for contact hole etchants is blocked from the metal gate. A manufacturing method of the semiconductor structure with a cutoff leakage path is also provided in the present disclosure. In some embodiments, 70% of the metal gates are retained after the contact hole formation by utilizing the operations disclosed in the present disclosure.

FIG. 1 shows a cross sectional view of a metal gate transistor structure 10 without a source/drain contact plug, in accordance to some embodiments of the present disclosure. The metal gate transistor structure 10 includes a substrate 100, a metal gate 103 positioned on the substrate, a dielectric layer 105 surrounding the metal gate 103, and an etch stop layer 107A, 107B over the metal gate 103 and the dielectric layer 105. In some embodiments, the substrate 100 is a semiconductor substrate including an elementary semiconductor such as silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate 100 may be a semiconductor on insulator, such as a silicon on insulator (SOI), or a thin film transistor (TFT). In some examples, the substrate 100 may include a doped epi layer or a buried layer. In other examples, the substrate 100 may have a multilayer compound semiconductor structure. In some embodiments, the substrate 100 may comprise a non-semiconductor material, such as glass.

The substrate 100 may include various doping configurations depending on design requirements as known in the art. In some embodiments, the substrate 100 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure. The substrate 100 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the metal gate transistor structure 10 may be formed by complementary metal-oxide-semiconductor (CMOS) technology processing, and thus some processes are not described in detail herein. In some embodiments, the metal gate transistor structure 10 may include epitaxial growths in the source and drain regions on each side of the gate structure and forming a raised source and drain regions 101, the epitaxial growths imparting tensile strain or compressive strain to the channel region.

Figure 4:
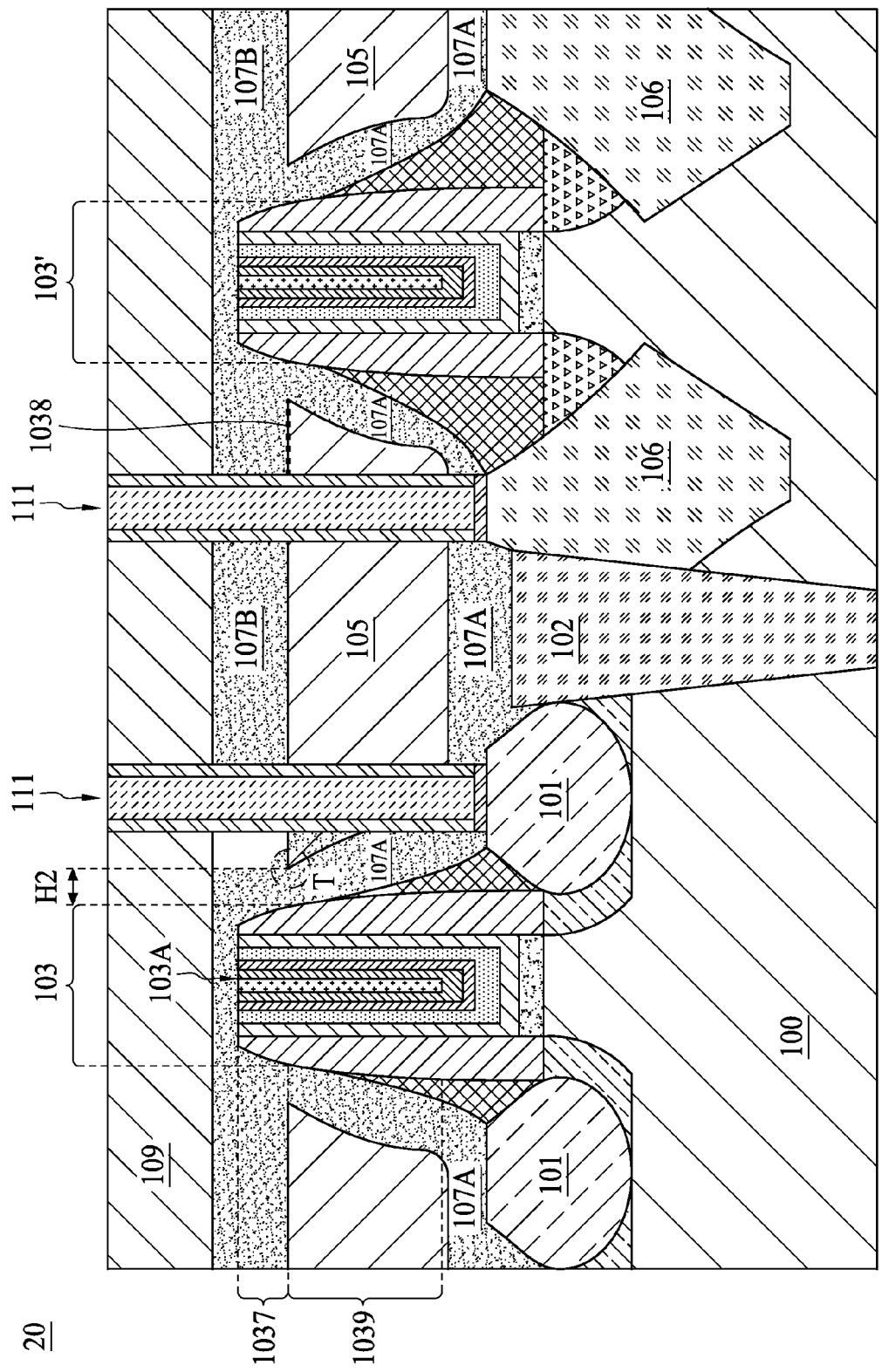
FIG. 4 is a cross sectional view of a metal gate structure with a source/drain contact, in accordance with some embodiments of the present disclosure.

At least one isolation region 102 may be formed on the substrate 100 to isolate various regions, for example, to isolate NMOS and PMOS transistor device regions as shown in FIG. 4. The isolation region 102 may utilize isolation technology, such as local oxidation of silicon (LOCOS) or shallow trench isolation (STI), to define and electrically isolate the various regions. In the present embodiment, the isolation region 102 includes an STI. The isolation region 102 may comprise silicon oxide, silicon nitride, silicon oxynitride, fluoride-doped silicate glass (FSG), a low-K dielectric material, other suitable materials, and/or combinations thereof.

Referring to FIG. 1, the metal gate 103 may include a gate spacer 1031, which are positioned on each side of the metal gate 103, composed of, for example, a nitride material (e.g., silicon nitride). The gate spacers 1031 may include a dielectric material such as silicon nitride, silicon oxide, silicon carbide, silicon oxynitride, other suitable materials, and/or combinations thereof. The gate spacers 1031 may be used to offset the source and drain regions 101 (also referred to as heavily doped source/drain regions), as opposed to the lightly doped source/drain regions 101'. In some embodiments, a sidewall of the metal gate described in the present disclosure refers to the outer surface of the gate spacer 1031.

In FIG. 1, the etch stop layer 107A, 107B may include silicon nitride, silicon oxynitride, amorphous carbon material, silicon carbide and/or other suitable materials. The etch stop layer 107A, 107B composition may be selected based upon etching selectivity to one or more additional features of the metal gate transistor structure 10. In the present embodiment, the etch stop layer 107B is a middle contact etch stop layer (MCESL) composed at least of silicon nitride, and the etch stop layer 107A is a bottom contact etch stop layer (BCESL) composed of the same of different dielectric materials as those in the MCESL. The etch stop layer 107A, 107B may possess any suitable thickness, for example, from about 30 Å to about 150 Å.

In FIG. 1, the dielectric layer 105 may include materials such as silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, non-porous materials, porous materials, and/or combinations thereof. In some embodiments, the dielectric layer 105 may include a high density plasma (HDP) dielectric material (e.g., HDP oxide) and/or a high aspect ratio process (HARP) dielectric material (e.g., HARP oxide). The dielectric layer 105 may possess any suitable thickness, such as from about 3000 Å to about 5000 Å. It is understood that the dielectric layer 105 may comprise one or more dielectric materials and/or one or more dielectric layers.

As shown in FIG. 1, the metal gate 103 refers to the gate spacer 1031 and several metal layers (1032, 1033, 1034, 1035, 1036). In some embodiments, the several metal gate layers include an interlayer or a high k dielectric layer 1032, a high k dielectric capping layer 1033, a barrier or an etch stop layer 1034, a work function metal layer 1035, and a metal filling layer 1036. People having ordinary skill in the art shall understand that various sequence or additional/reduced metal layer may be constructed and thus is not exceeding the scope of the present disclosure.

Referring to FIG. 1, the metal gate 103 possesses a first surface 103A, in some embodiments, as a top surface of the metal gate 103. The dielectric layer 105 possesses a second surface 105A, in some embodiments, as a top surface of the dielectric layer 105. The first surface 103A can be further defined as an interface between the top surface of the metal gate and the etch stop layer 107B, and the second surface 105A can be further defined as an interface between the dielectric layer 105 and the etch stop layer 107B. In FIG. 1, the etch stop layer 107B is in contact with the first surface 103A and the second surface 105A at different level of height, respectively. In other words, for example, the first surface 103A is higher than the second surface 105A by a predetermined distance H1.

In some embodiments, the predetermined distance H1 between the first surface 103A and the second surface 105A is in a range of from about 30 Å to about 80 Å. For example, the first surface 103A of the metal gate 103 is 50 Å higher than the second surface 105A of the dielectric layer 105. In some embodiments, the etch stop layer 107A, 107B includes two portions: an upper portion 107B and a lower portion 107A. The upper portion 107B is positioned over the metal gate 103 and the dielectric layer 105, whereas the lower portion 107A is in contact with a third surface 105B of the dielectric layer. The third surface 105B is further described later in the present disclosure. As shown in FIG. 1, the upper portion 107B and the lower portion 107A of the etch stop layer from a continuous region where the upper portion 107B is physically in connection to the lower portion 107A at least at the position close to the sidewall of the metal gate 103.

In some embodiments, the lower portion 107A surrounds a third surface 105B of the dielectric layer 105. The third surface 105B of the dielectric layer 105 refers to the contour of the dielectric layer 105 other than the second surface 105A. In other words, the third surface 105B may include a horizontal part located at a bottom of the dielectric layer 105 and a vertically oblique part located at a sidewall of the dielectric layer 105. As discussed previously, the lower portion 107A can be a BCESL which is conformal to the morphology of the metal gate 103, and thus the lower portion 107A is surrounding the third surface 105B of the dielectric layer 105.

Figure 2:
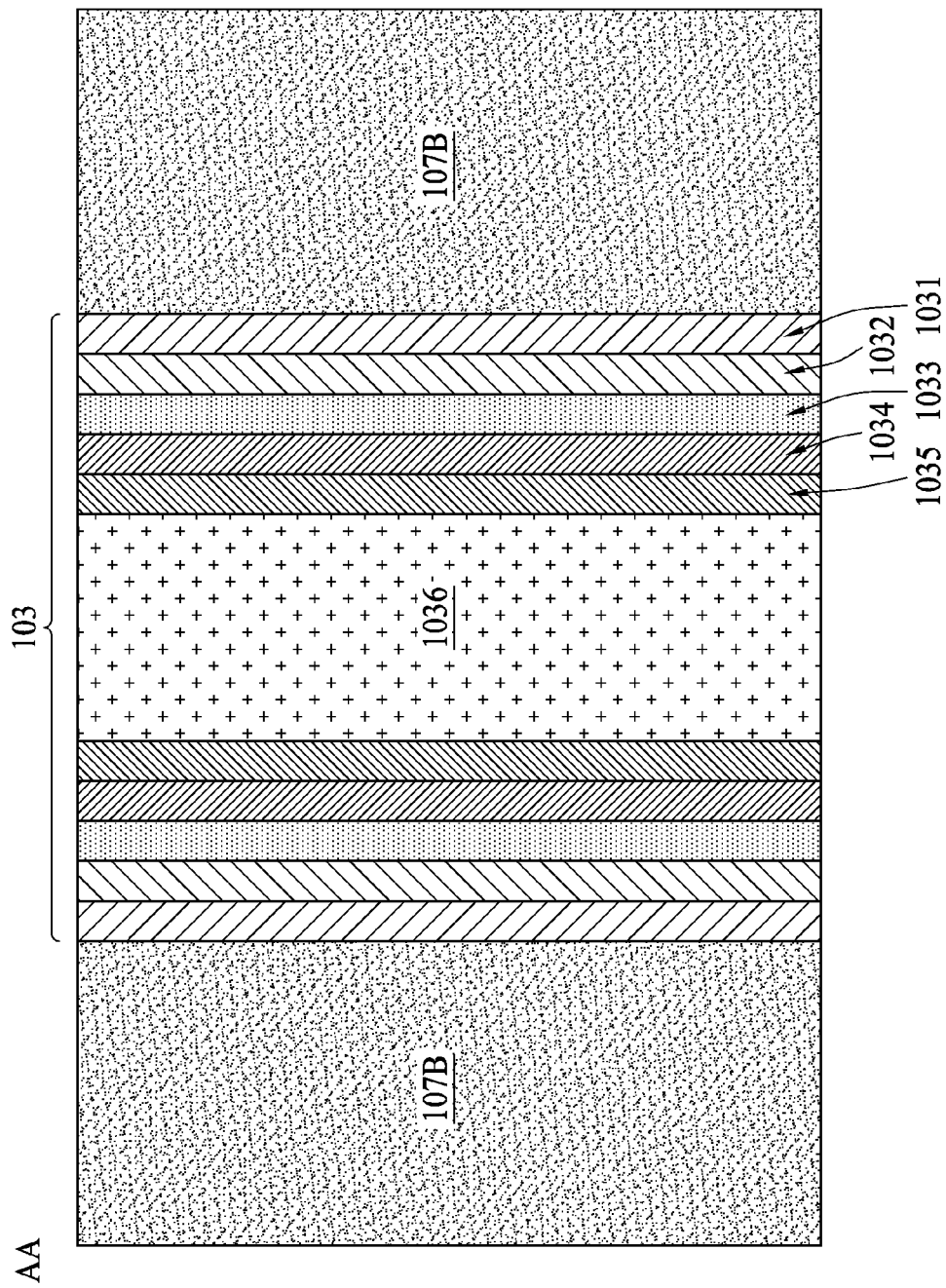
FIG. 2 is a top view dissecting from line AA of the metal gate structure shown in FIG. 1, in accordance with some embodiments of the present disclosure.
Figure 3:
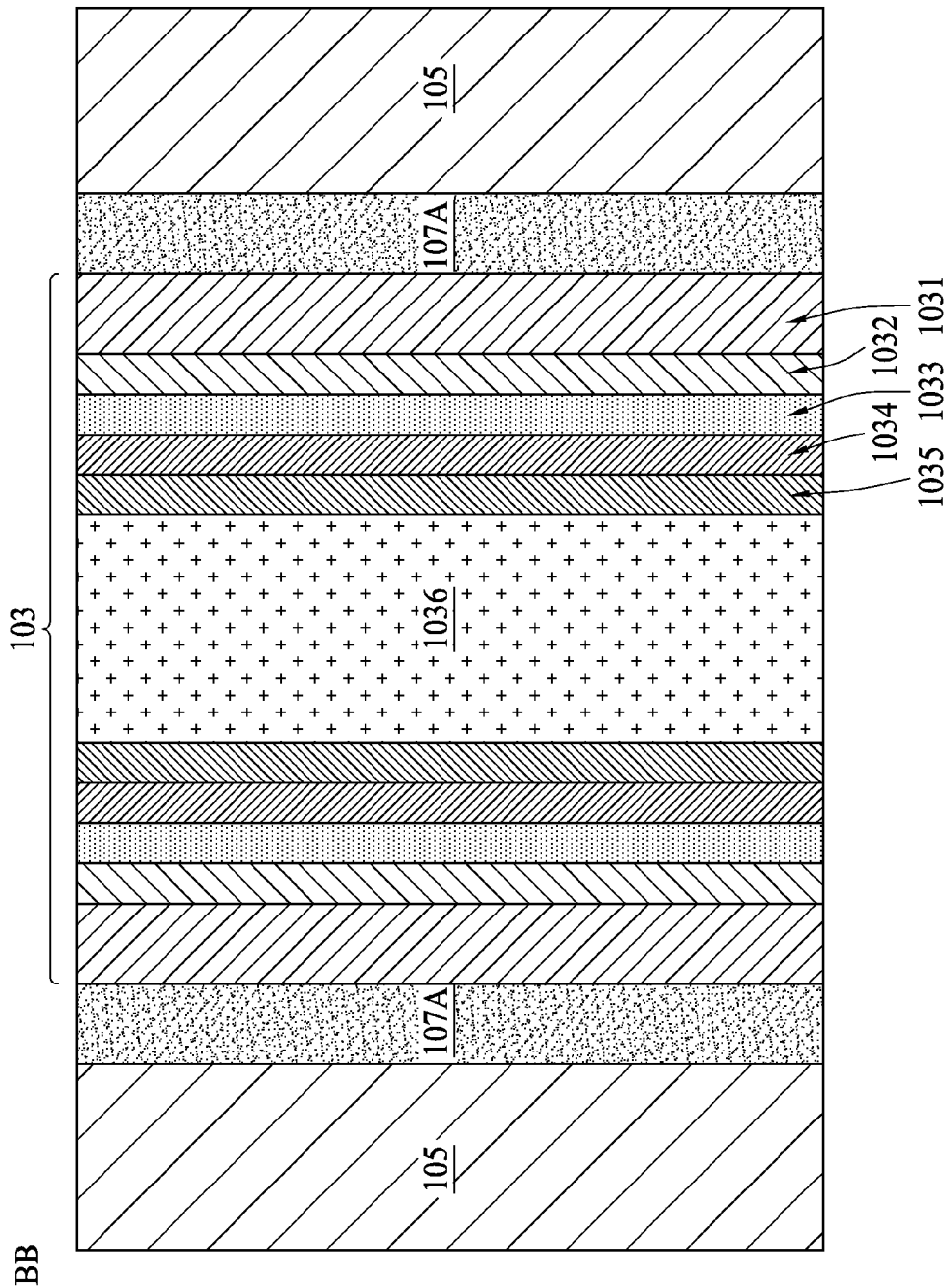
FIG. 3 is a top view dissecting from line BB of the metal gate structure shown in FIG. 1, in accordance with some embodiments of the present disclosure.

To further clarify the metal gate transistor structure 10 in FIG. 1, a top perspective viewing from the plane sectioning along line AA and line BB of FIG. 1 are shown in FIG. 2 and FIG. 3, respectively. In FIG. 1 and FIG. 2, line AA is crossing the first surface 103A of the metal gate 103 and laterally extending to the upper portion 107B of the etch stop layer. In FIG. 1 and FIG. 3, line BB is crossing the second surface 105A and laterally extending to the metal gate 103. In FIG. 2, the metal gate 103 includes the gate spacer 1031, the interlayer or a high k dielectric layer 1032, the high k dielectric capping layer 1033, the barrier or the etch stop layer 1034, the work function metal layer 1035, and the metal filling layer 1036. The upper portion 107B of the etch stop layer is at the two sides of the metal gate 103. In FIG. 3, labels having identical numerals are referred to the same elements as those in FIG. 1 and FIG. 2, and are not repeated here for simplicity. Compared to FIG. 2, the top perspective view in FIG. 3 further includes the dielectric layer 105 sandwiching the metal gate 103 and the lower portion 107A of the etch stop layer.

As shown in FIG. 2, the upper portion 107B of the etch stop layer is in contact with the sidewall of the metal gate 103. In some embodiments, the sidewall of the metal gate 103 can be the gate spacer 1031. Similarly, as shown in FIG. 3, the lower portion 107A of the etch stop layer is in contact with the sidewall of the metal gate 103. Because a lower portion of the metal gate 103 is surrounded both by the etch stop layer 107A and the dielectric layer 105, the lower portion 107A of the etch stop layer has a defined width H2 which can be measured from the edge of the second surface 105A to the sidewall of the metal gate 103.

As discussed previously in the present disclosure, the etch stop layer 107A, 107B and the dielectric layer 105 may be composed of different materials possessing different etch rates. For example, under a dry etch operation including fluorine-containing gases (e.g., $CF_4$, $SF_6$, $CH_2F_2$, $CHF_3$, and/or $C_2F_6$), the etch rate of the etch stop layer 107A, 107B (e.g. nitride-based layer) is slower than the etch rate of the dielectric layer 105 (e.g. oxide-based layer). In some embodiments, the selectivity (etch rate ratio of the dielectric layer 105 and the etch stop layer 107A, 107B) under a dry etch operation including fluorine-containing gases is around 4. On the other hand, under a wet etch operation including diluted hydrofluoric acid (HF) dipping process, the selectivity between the dielectric layer 105 and the etch stop layer 107A, 107B is in a range of from about 5 to about 10.

FIG. 4 is a cross sectional view of a metal gate structure 20 with a source/drain contact, in accordance with some embodiments of the present disclosure. The metal gate structure 20 includes a substrate 100, an NMOS metal gate 103, and a PMOS metal gate 103' on the substrate 100. In some embodiments, the NMOS structure may include epitaxially regrown source and drain regions 101 imparting a tensile strain to a channel region; the PMOS structure may include epitaxially regrown source and drain regions 106 imparting a compressive strain to a channel region. In some embodiments, the metal gate structure 20 is constructed in a FinFET, and thereby the substrate 100 is a semiconductor fin partially embedded in an insulating layer (not shown).

Referring to FIG. 4, the NMOS metal gate 103 includes a first portion 1037 and a second portion 1039. The first portion 1037 directs to an upper portion of the metal gate 103, surrounded by the upper portion 107B of the etch stop layer 107A, 107B or a first etch stop layer. The second portion 1039 directs to a lower portion of the metal gate 103, surrounded by the lower portion 107A (or a second etch stop layer previously discussed in the present disclosure) and a dielectric layer 105. Also can be seen from FIG. 4, an interface 1038 between the first etch stop layer 107B and the dielectric layer 105 is terminated at a predetermined distance H2 from the sidewall of the metal gate 103, and thus said interface 1038 is not in contact with the metal gate 103. In some embodiments, the predetermined distance H2 is in a range of from about 30 Å to about 80 Å.

In FIG. 4, the intersection of the first etch stop layer 107B, the second etch stop layer 107A, and the dielectric layer 105 form a triple point T. In some embodiments, the triple point T is lower than the first surface 103A of the metal gate 103. In other embodiments, the triple point T is laterally a distance H2 away from the sidewall of the metal gate 103. The NMOS metal gate 103 and its surrounding environment can be applied to the PMOS metal gate 103', and thus the detailed description of the PMOS metal gate 103' shown in FIG. 4 is omitted for simplicity.

Still referring to FIG. 4, the etch stop layer 107A, 107B and the dielectric layer 105 may be composed of different materials possessing different etch rates. For example, under a dry etch operation including fluorine-containing gases (e.g., $CF_4$, $SF_6$, $CH_2F_2$, $CHF_3$, and/or $C_2F_6$), the etch rate of the etch stop layer 107A, 107B (e.g. nitride-based layer) is at least 3 times slower than the etch rate of the dielectric layer 105 (e.g. oxide-based layer). In some embodiments, the selectivity (etch rate ratio of the dielectric layer 105 and the etch stop layer 107A, 107B) under a dry etch operation including fluorine-containing gases is around 4. On the other hand, under a wet etch operation including diluted hydrofluoric acid (HF) dipping process, the selectivity between the dielectric layer 105 and the etch stop layer 107A, 107B is in a range of from about 5 to about 10.

Still referring to FIG. 4, the source and drain contacts 111 electrically couple the source and drain regions 101, 106 of the metal gate structure 20 to metallization layers (not shown) and other semiconductor devices (not shown). The source and drain contacts 111 are composed of a contact hole filled with conductive materials. The contact hole at least penetrates through an oxide layer 109, the first etch stop layer 107B, the dielectric layer 105, and the second etch stop layer 107A, engaging respective silicide layers (not shown) over the source and drain regions 101, 106. In some embodiments, the conductive materials forming the contacts 111 include aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof.

The present disclosure also provides a method for manufacturing a semiconductor structure described herein. In some embodiments, the cross sectional views in FIG. 5 to FIG. 6 demonstrate forming a dummy gate 104 on a substrate; the cross sectional view in FIG. 7 demonstrates forming a first etch stop layer 107A over the dummy gate 104 and forming a dielectric layer 105 over the dummy gate 104; the cross sectional views in FIG. 8 to FIG. 10 demonstrate replacing the dummy gate 104 with a metal gate 103; the cross sectional view in FIG. 11 demonstrates etching back the dielectric layer 105 to form a second surface 105A of the dielectric layer lower than a first surface 103A of the metal gate; the cross sectional views from FIG. 12 to FIG. 13 demonstrate forming a second etch stop layer 107B over the metal gate 103 and the dielectric layer 105.

Figure 5:
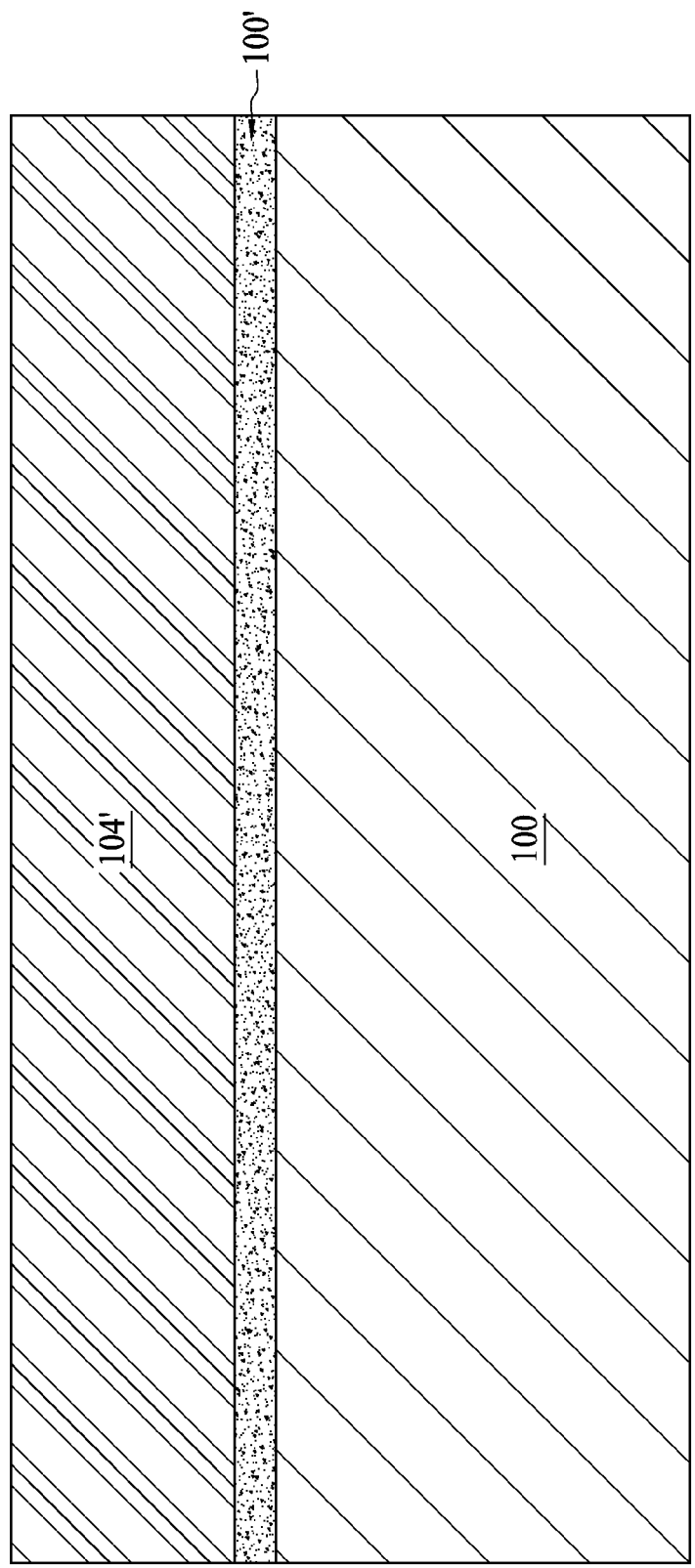
FIG. 5 to FIG. 10 are cross sectional views showing operations of a method for manufacturing a metal gate of a semiconductor structure, in accordance with some embodiments of the present disclosure.
Figure 6:
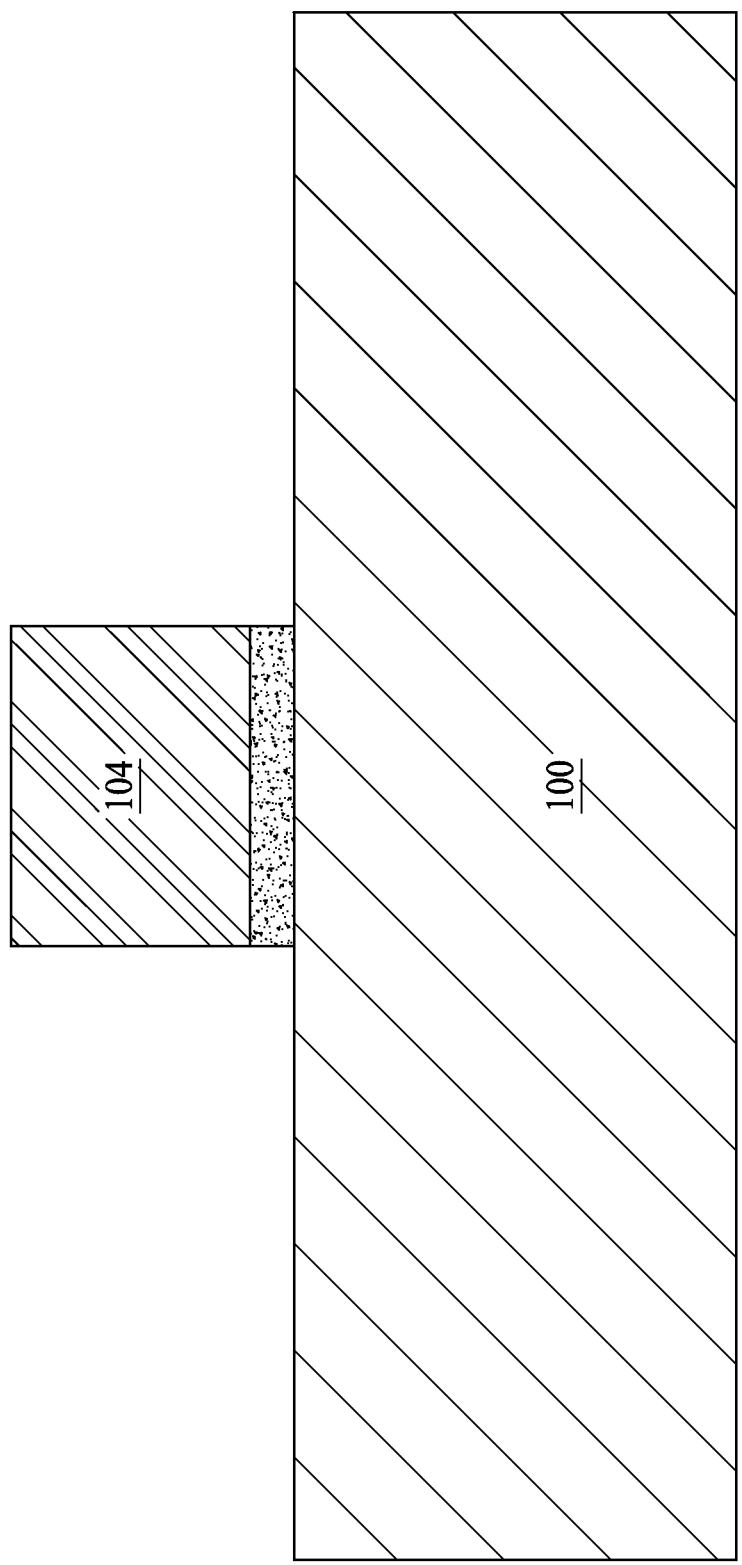

In FIG. 5, a dummy gate layer 104' is deposited on a substrate 100 and subsequently photolithography patterned to form a dummy gate 104 in FIG. 6. An optional interfacial layer 100' may be deposited between the substrate and the dummy gate layer 104' and subsequently patterned. The deposition operation may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), epitaxial growth methods (e.g., selective epitaxy growth), sputtering, plating, spin-on coating, other suitable methods, and/or combinations thereof. The photolithography patterning operation may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and/or molecular imprint. The etching processes may include dry etching, wet etching, and/or other etching methods (e.g., reactive ion etching). The etching process may also be either purely chemical (plasma etching), purely physical (ion milling), and/or combinations thereof.

Figure 7:
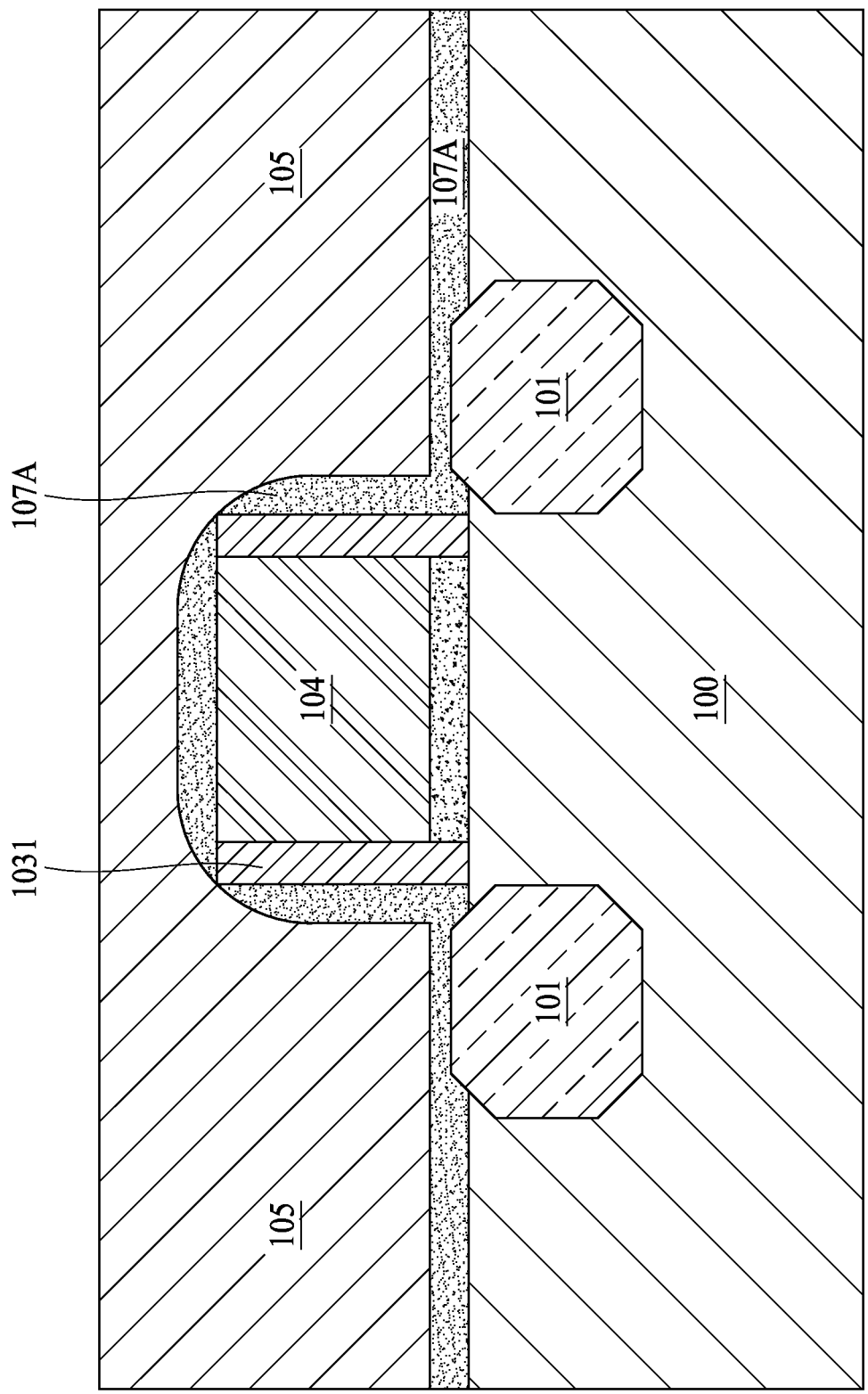

In FIG. 7, a gate spacer 1031 is formed at the sidewall of the dummy gate 104, and a lower portion 107A of the etch stop layer (or a second etch stop layer previously referred to in the present disclosure) is conformally deposited over the dummy gate 104. In some embodiments, the gate spacer 1031 and the bottom etch stop layer 107A are deposited by CVD operation suitable for nitride materials. A dielectric layer 105 is then blanket formed over the dummy gate 104 and the conformal layers. As shown in FIG. 7, in some embodiments, the source/drain regions 101 can be epitaxially regrown by, for example, a stress memorization technique (SMT), or other suitable regrowth operation prior to the formation of the bottom etch stop layer 107A.

Figure 8:
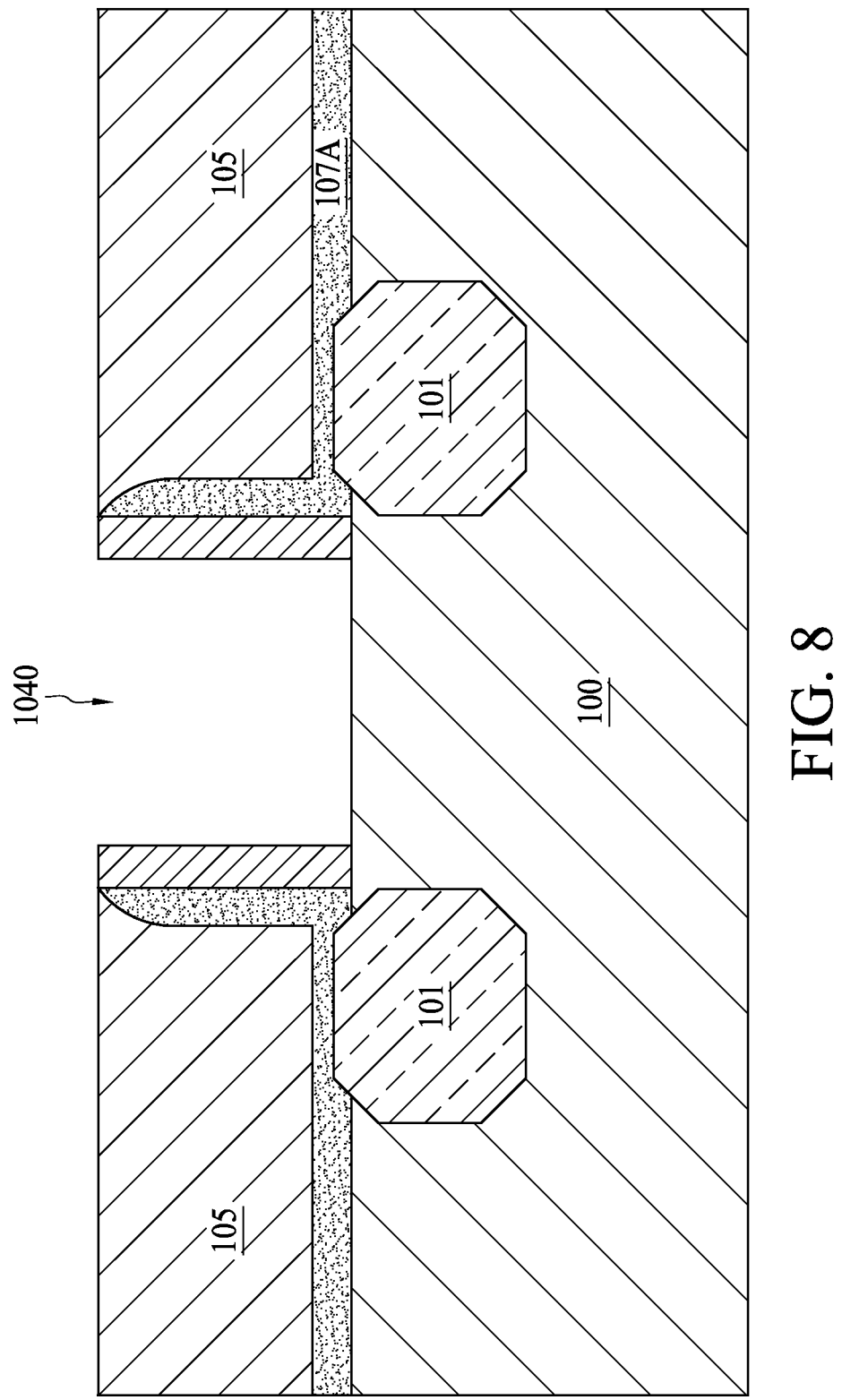
Figure 9:
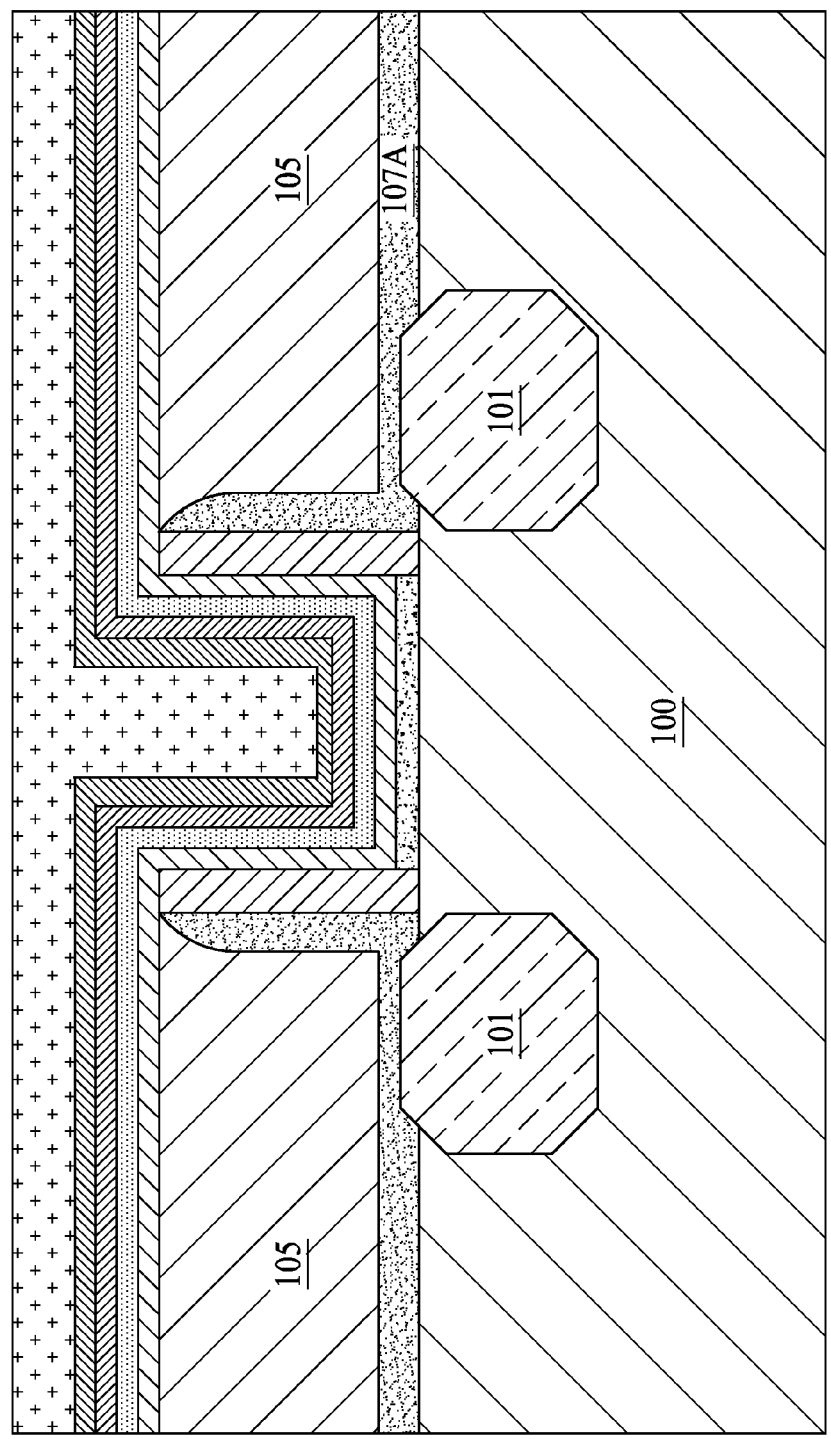
Figure 10:
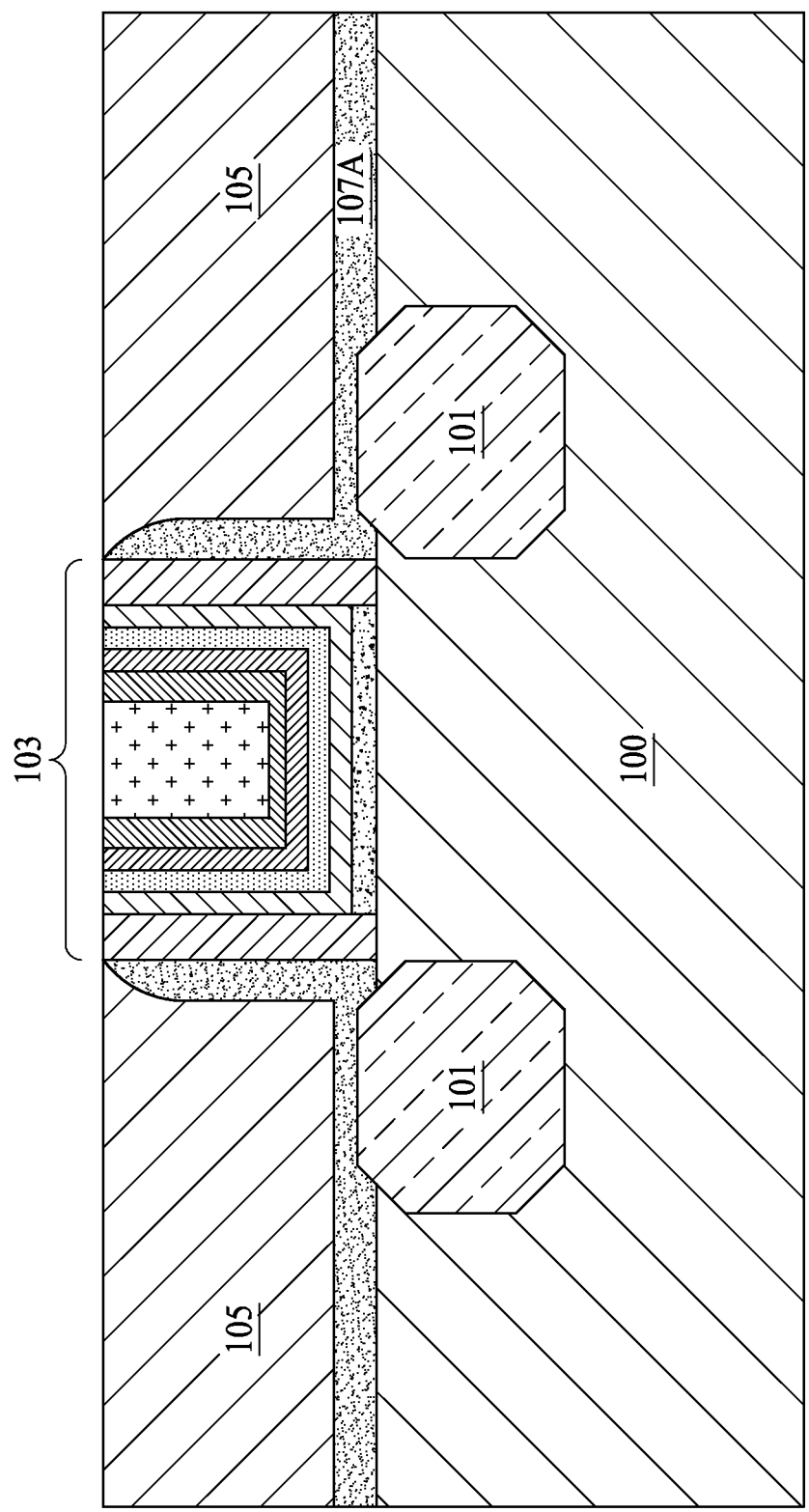

FIG. 8 to FIG. 10 show a removal of the dummy gate 104 and a replacement by a metal gate 103. A top planarization operation may be conducted on the intermediate semiconductor structure of FIG. 7 to remove the dielectric layer 105, the bottom etch stop layer 107A, and the gate spacer 1031, until the exposure of a top surface of the dummy gate 104. In FIG. 8, the dummy gate 104 is removed to form a recess 1040 by any suitable etching operations. In some embodiments, a high k dielectric layer 1032, a high k dielectric capping layer 1033, a barrier or an etch stop layer 1034, a work function layer 1035, and a metal filling layer 1036 are sequentially formed in the recess 1040.

Among the multiple layers in the metal gate 103, the work function layer 1035 is tuned to have a proper work function and comprises any suitable material. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the work function layer 1035 may include doped-conducting metal oxide materials. The metal filling layer 1036 includes any suitable conductive material previously discussed herein. Further, the metal filling layer 1036 may be doped polycrystalline silicon with the same or different doping. In some embodiment, the metal filling layer 1036 includes aluminum. It is understood that additional layers may be formed above and/or below the work function layer 1035 and/or metal filling layer 1036, including liner layers, interface layers, seed layers, adhesion layers, barrier layers, etc. It is further understood that the work function layer 1035 and metal filling layer 1036 may include one or more materials and/or one or more layers.

In FIG. 10, a removal operation is performed to remove the metal gate layers (1032, 1033, 1034, 1035, 1036) positioned over the dielectric layer 105 until the exposure of a top surface 105' of the dielectric layer 105. In some embodiments, the top surface 105' is coplanar to the first surface 103A of the metal gate 103. In some embodiments, the removal operation includes a chemical mechanical polishing (CMP) operation and/or other suitable planarization operations.

Following FIG. 10, the top surface 105' of the dielectric layer 105 is further etched back to form a depressed surface 105A (or a second surface previously discussed in the present disclosure), for example, about 30 Å to about 80 Å of the dielectric layer 105 is removed and the second surface 105A is lower than the first surface 103A by a predetermined distance H1. In some embodiments, the predetermined distance H1 shall be large enough to allow the subsequently formed first etch stop layer 107B to contact with the sidewall of the metal gate 103, but small enough to prevent the resistivity of the semiconductor structure from increasing.

The etching back operation may include one or more dry etching processes, wet etching processes, other suitable processes (e.g., reactive ion etching), and/or combinations thereof. In some embodiments, any etching operation demonstrating a sufficient higher etch rate on the dielectric layer 105 than on the metal gate 103 and the second etch stop layer 107A is within the contemplated scope of the present disclosure. In some embodiments, etching operations showing an etch rate of about 0:1:4 among the metal gate 103, the second etch stop layer 107A, and the dielectric layer 105 can be used in the present disclosure.

In some embodiments, the etching back operation may be either purely chemical (plasma etching), purely physical (ion milling), and/or combinations thereof. For example, a dry etching process may be implemented in an etching chamber using process parameters including a radio frequency (RF) source power, a bias power, a pressure, a flow rate, a wafer temperature, other suitable process parameters, and/or combinations thereof. The dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. In some embodiments, the dry etching process utilizes an $O_2$ plasma treatment and/or an $O_2/N_2$ plasma treatment. Further, the dry etching process may be performed for any suitable time. A wet etching process may utilize a hydrofluoric acid (HF) solution for a HF dipping process. The HF solution may have any suitable concentration (e.g., 1:100). In some embodiments, a wet etching process may apply a diluted hydrofluoric acid to the intermediate semiconductor structure.

Figure 11:
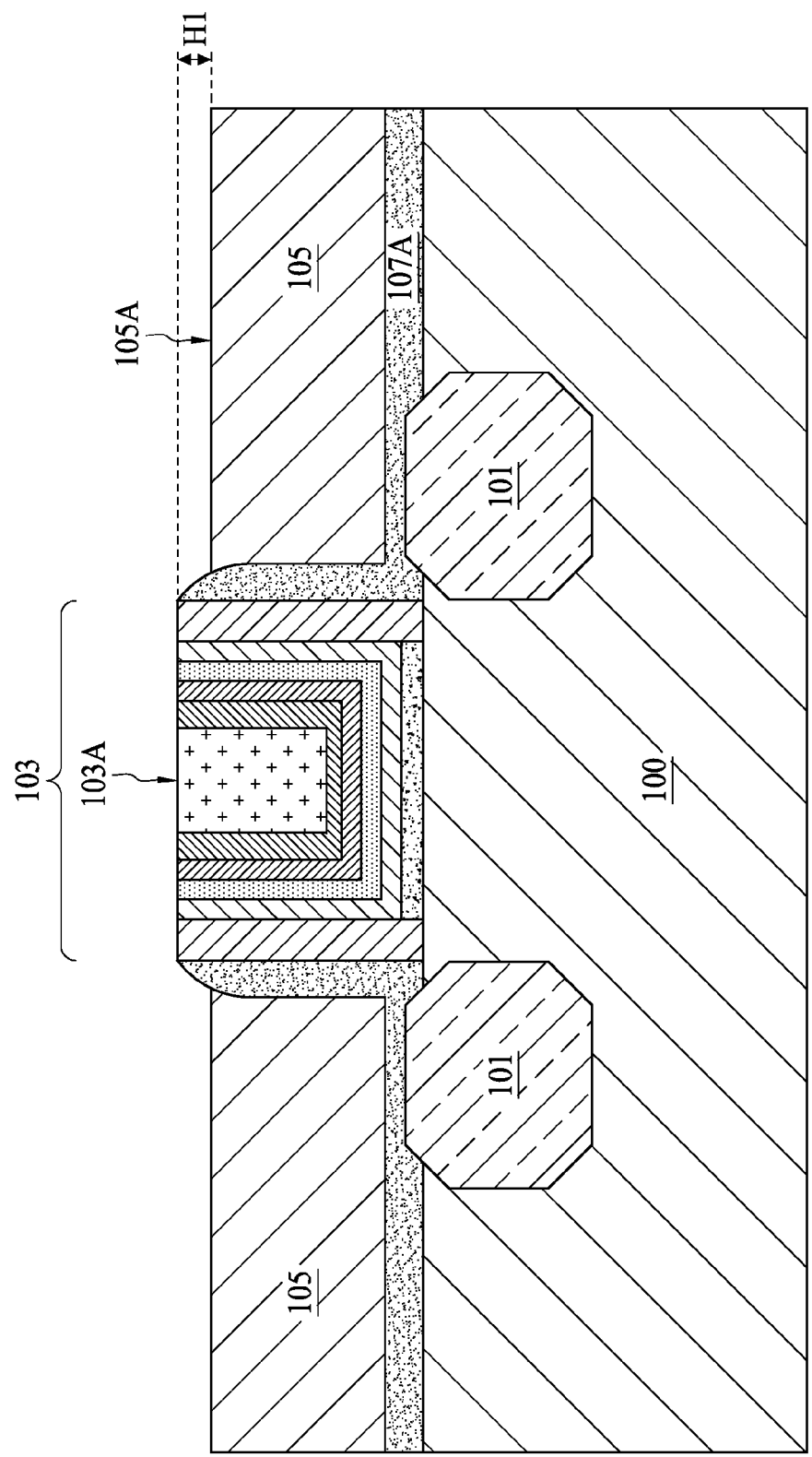
FIG. 11 to FIG. 13 are cross sectional views showing operations of a method for manufacturing an etch stop layer of a semiconductor structure, in accordance with some embodiments of the present disclosure.
Figure 12:
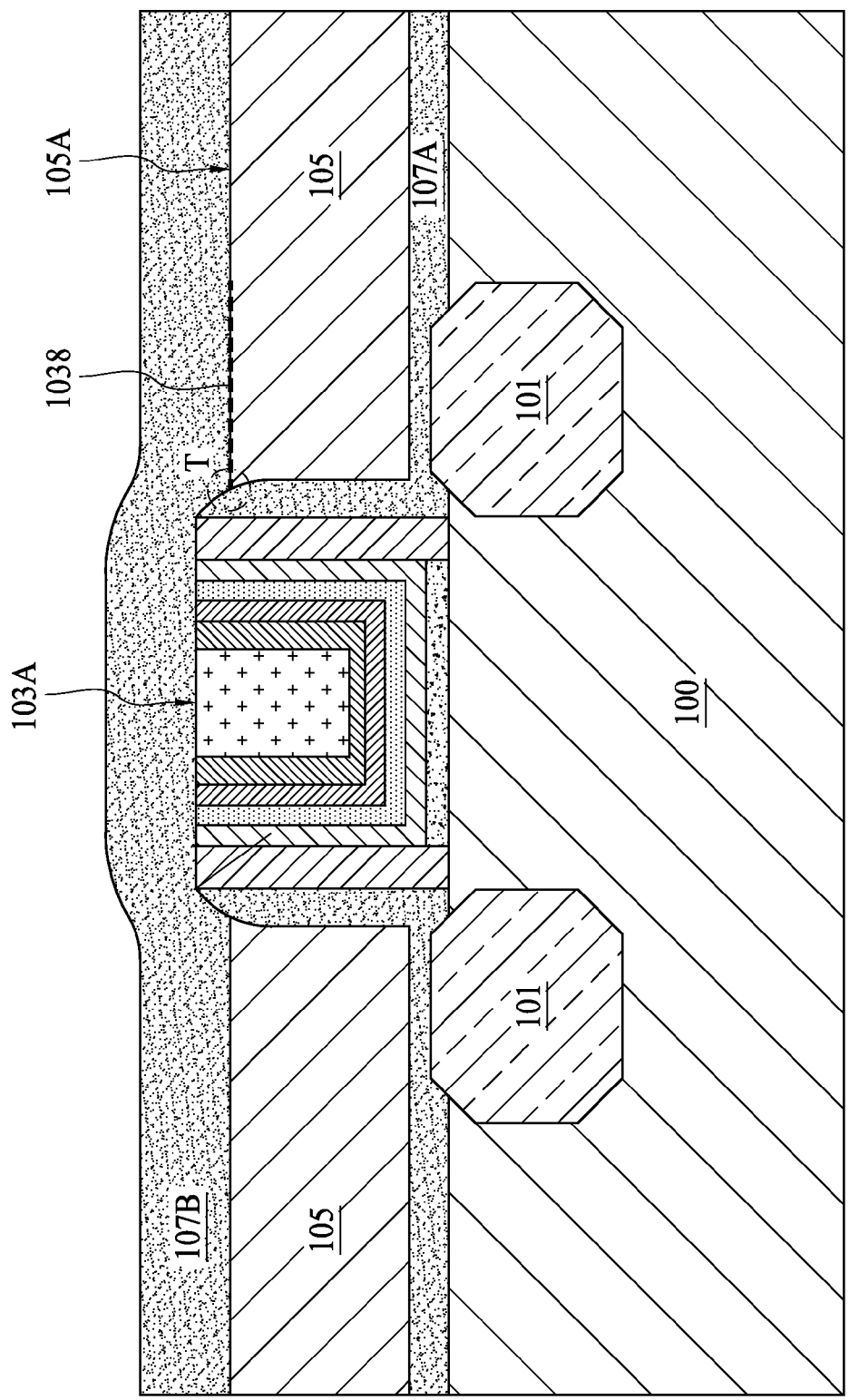
Figure 13:
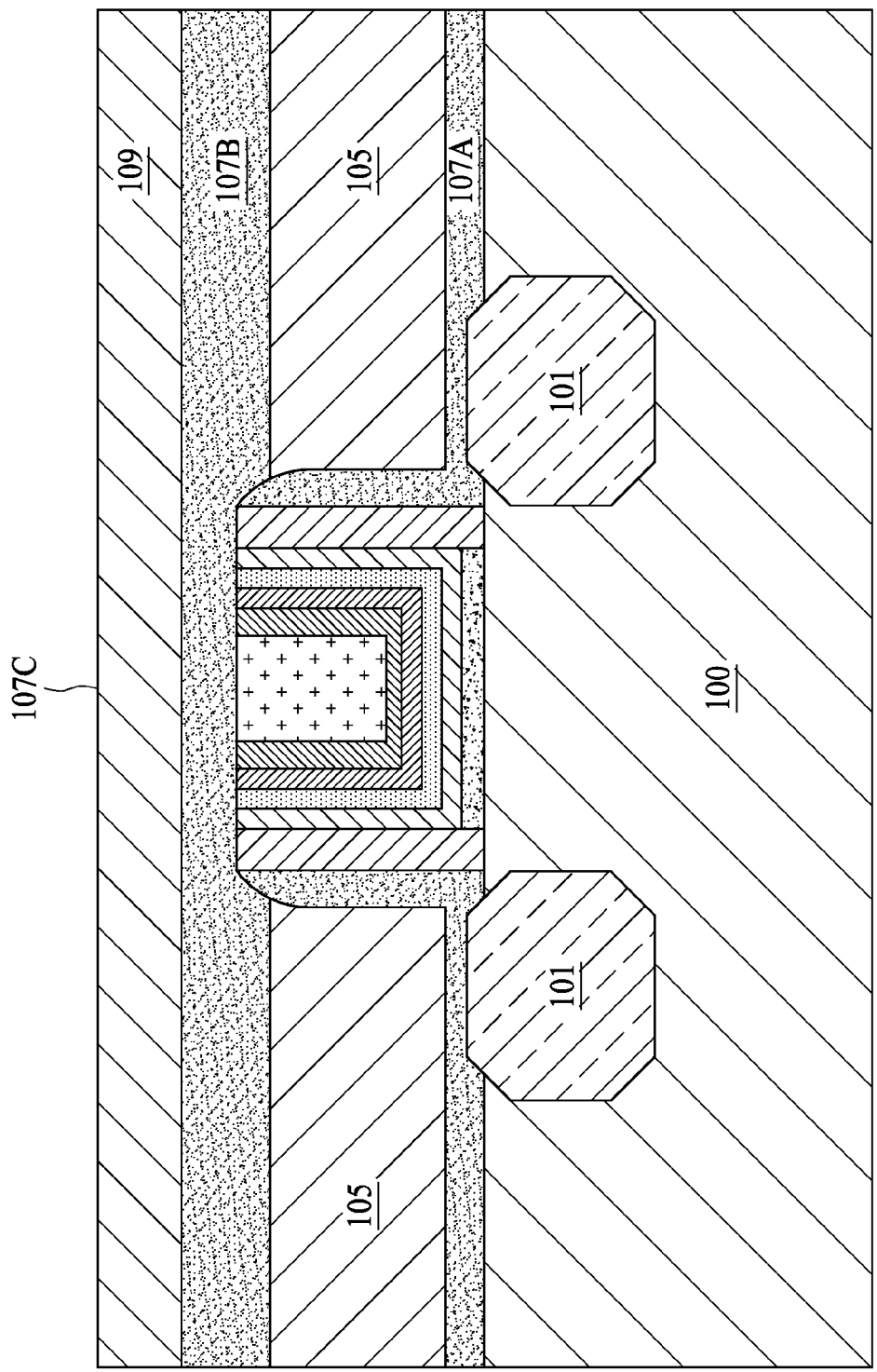

Following FIG. 11, an upper etch stop layer 107B (or a first etch stop layer previously discussed in the present disclosure) is formed over the metal gate 103 and the dielectric layer 105 by a nitride deposition operation as shown in FIG. 12. In some embodiments, the first etch stop layer 107B is deposited using the same operation as the second etch stop layer 107A. In other embodiments, the first etch stop layer 107B is deposited using different operations as the second etch stop layer 107A. By using the operations described in the present disclosure, the interface 1038 between the first etch stop layer 107B and the dielectric layer 105 is below the first surface 103A of the metal gate 103, as well as the first etch stop layer 107B and the second etch stop layer 107A are in connection to each other in proximity to the sidewall of the metal gate 103. In other words, the portion connecting the first etch stop layer 107B and the second etch stop layer 107A terminates the interface 1038, and prevents the triple point T from contacting the sidewall of the metal gate 103. In FIG. 13, a planarization operation is conducted on the first etch stop layer 107B to form a leveled surface 107C, and then subsequently an oxide layer 109 is formed over the leveled surface 107C.

Figure 14:
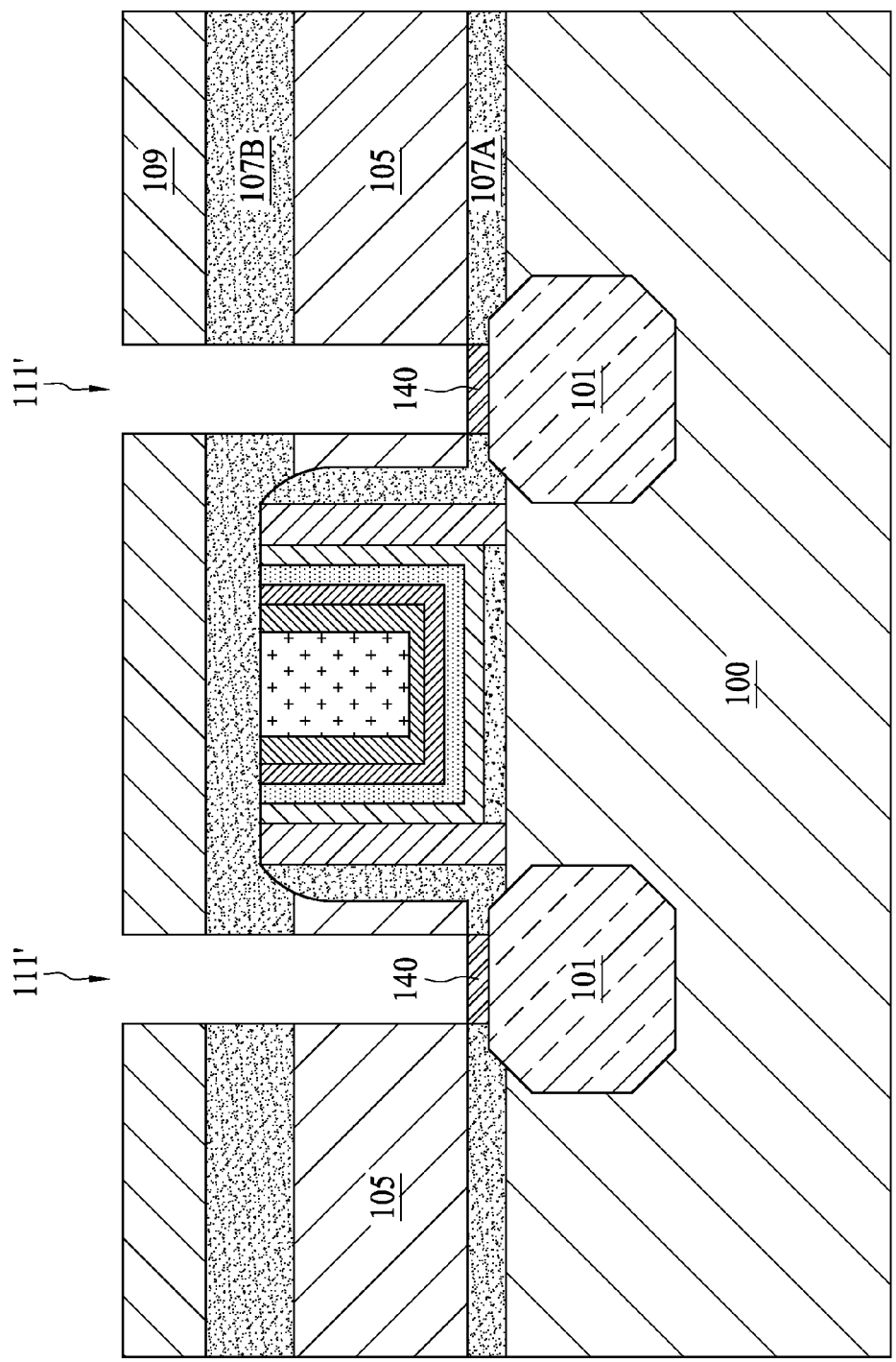
FIG. 14 to FIG. 15 are cross sectional views showing operations of a method for manufacturing a source/drain contact of a semiconductor structure, in accordance with some embodiments of the present disclosure.
Figure 15:
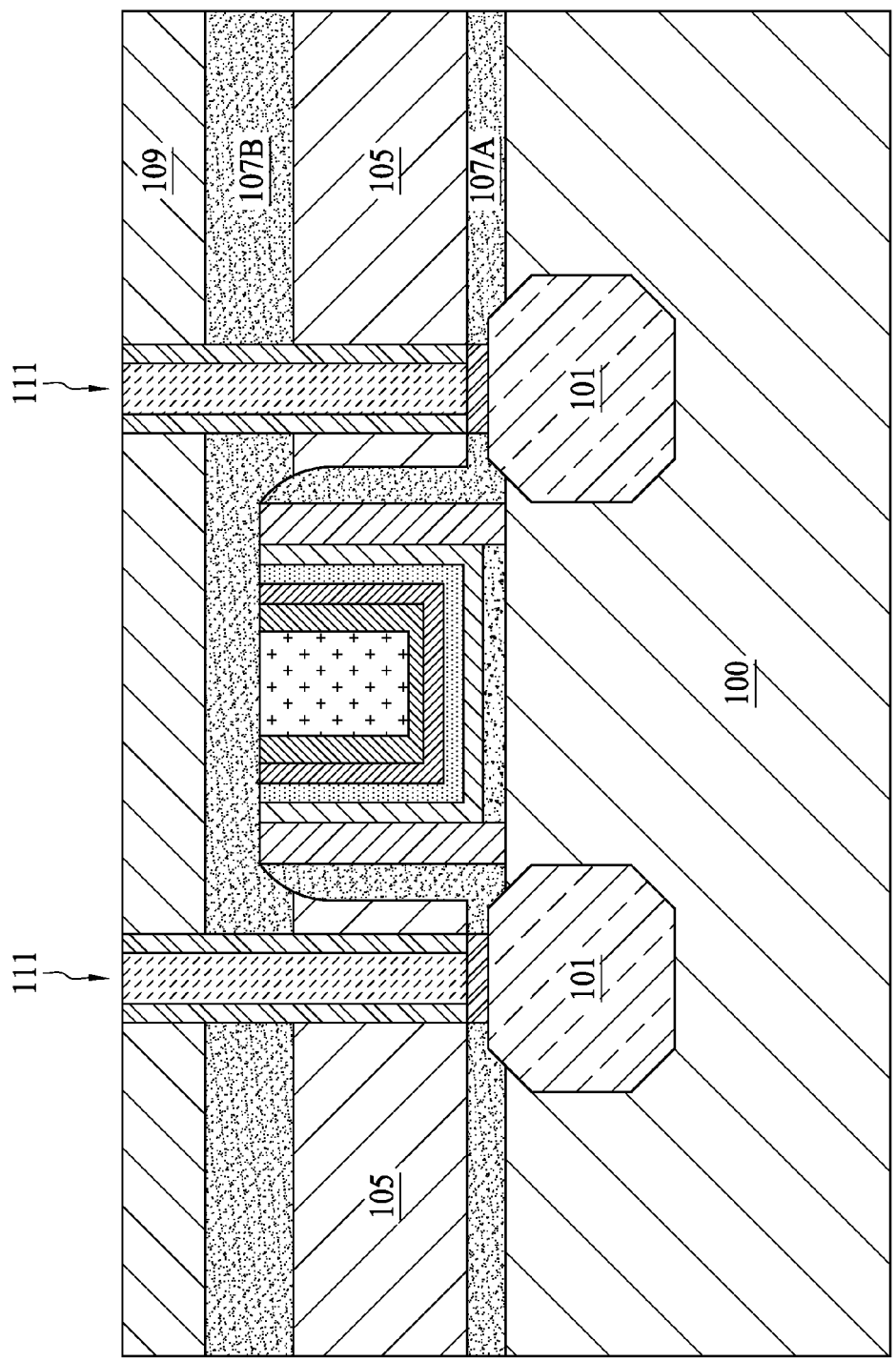

FIG. 14 to FIG. 15 show a contact formation operation according to some embodiments of the present disclosure. In FIG. 14, the oxide layer 107C, the first etch stop layer 107B, the dielectric layer 105, and the second etch stop layer 107A is removed to form a contact hole 111' via a photolithography operation. In some embodiments, a bottom of the contact hole is further undergone a silicidation (or self-aligned silicidation) operation. Silicide material 140 is formed on the surface of the source/drain region. Contacts 111 in FIG. 15 provide electrical connection to the S/D regions 101 (via silicide regions). The contacts 111 may be formed by filling the contact holes 111' with conductive materials. The conductive materials may include aluminum, copper, tungsten, titanium, tantalum, titanium nitride, tantalum nitride, nickel, cobalt, TaC, TaSiN, TaCN, TiAl, TiAlN, other suitable materials, and/or combinations thereof.

FIG. 5 to FIG. 15 of the present disclosure do not limit the semiconductor structure to a planar transistor, but are intended to encompass the non-planar transistor such as a FinFET. The cross sectional views for the operations provided in FIG. 5 to FIG. 15 can be interpreted as a metal gate FinFET structure with a semiconductor fin 100 instead of a substrate 100 previously referred to in the present disclosure.

Some embodiments of the present disclosure provide a semiconductor structure, including a substrate, a metal gate, a dielectric layer, and an etch stop layer. The metal gate is positioned on the substrate and possesses a first surface. The dielectric layer surrounds the metal gate and possesses a second surface. The etch stop layer is over the metal gate and the dielectric layer, and the etch stop layer is in contact with both the first surface and the second surface. The first surface is elevated or higher than the second surface.

In some embodiments of the present disclosure, the first surface is higher than the second surface by a range of from about 30 Å to about 80 Å.

In some embodiments of the present disclosure, the etch stop layer surrounds a third surface of the dielectric layer.

In some embodiments of the present disclosure, the etch stop layer includes an upper portion and a lower portion. The upper portion and the lower portion forms a continuous etch stop layer.

In some embodiments of the present disclosure, the lower portion of the etch stop layer is in contact with a sidewall of the metal gate.

In some embodiments of the present disclosure, the upper portion of the etch stop layer is in contact with a sidewall of the metal gate.

In some embodiments of the present disclosure, the etch stop layer includes materials with an etch rate lower than an etch rate of the dielectric layer under a fluorine-containing etch.

Some embodiments of the present disclosure provide a semiconductor structure. The semiconductor includes a substrate and a gate positioned on the substrate. The gate further includes a first portion and a second portion. The first portion of the gate is surrounded by a first etch stop layer, and the second portion of the gate is surrounded by a second etch stop layer and a dielectric layer. An interface between the first etch stop layer and the dielectric layer is not in contact with the gate.

In some embodiments of the present disclosure, the first etch stop layer, the second etch stop layer and the dielectric layer form a triple point away from the gate.

In some embodiments of the present disclosure, a separation between the triple point and a sidewall of the gate is in a range of from about 30 Å to about 80 Å.

In some embodiments of the present disclosure, the first etch stop layer and the second etch stop layer includes materials with an etch rate at least three times slower than an etch rate of the dielectric layer under a fluorine-containing etch.

In some embodiments of the present disclosure, the semiconductor structure further includes a contact connecting a source or a drain region to an external conductive path. The contact penetrates the first etch stop layer, the dielectric layer, and the second etch stop layer to reach the source or the drain region.

In some embodiments of the present disclosure, the gate is an NMOS metal gate or a PMOS metal gate.

Some embodiments of the present disclosure provide a method for manufacturing a semiconductor structure. The method includes forming a dummy gate on a substrate; forming a second etch stop layer over the dummy gate; forming a dielectric layer over the dummy gate; replacing the dummy gate with a metal gate; etching back the dielectric layer to expose a portion of the sidewall of the meta gate; and forming a first etch stop layer over the metal gate and the dielectric layer.

In some embodiments of the present disclosure, the etching back the dielectric layer includes performing a dry etch operation etching back the dielectric layer by a thickness of from about 30 Å to about 80 Å.

In some embodiments of the present disclosure, the etching back the dielectric layer includes performing a dry etch with an etch rate ratio of about 0:1:4 among the metal gate, the first etch stop layer; and the dielectric layer.

In some embodiments of the present disclosure, the etching back the dielectric layer includes performing a dry etch with fluorine-containing materials.

In some embodiments of the present disclosure, the forming a first etch stop layer over the metal gate and the dielectric layer includes depositing the first etch stop layer and planarizing the deposited first etch stop layer.

In some embodiments of the present disclosure, the replacing the dummy gate with a metal gate includes removing the dummy gate, forming the metal gate, and removing the metal gate to expose a top surface of the dielectric layer.

In some embodiments of the present disclosure, the method for manufacturing the semiconductor structure further includes forming a source or a drain contact that is penetrating the second etch stop layer, the dielectric layer, and the first etch stop layer to reach the source or the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a metal gate with a first surface, positioned on the substrate; and
   a dielectric layer with a second surface, surrounding the metal gate; and
   an etch stop layer at least over the metal gate and the dielectric layer, in contact with the first surface and the second surface,
   wherein the first surface is higher than the second surface.

2. The semiconductor structure of claim 1, wherein the first surface is higher than the second surface by a range of from about 30 Å to about 80 Å.

3. The semiconductor structure of claim 1, wherein the etch stop layer surrounds a third surface of the dielectric layer.

4. The semiconductor structure of claim 3, wherein the etch stop layer comprises an upper portion and a lower portion, the upper portion and the lower portion constituting a continuous etch stop layer.

5. The semiconductor structure of claim 4, wherein the lower portion of the etch stop layer is in contact with a sidewall of the metal gate.

6. The semiconductor structure of claim 4, wherein the upper portion of the etch stop layer is in contact with a sidewall of the metal gate.

7. The semiconductor structure of claim 3, wherein the etch stop layer comprises materials with an etch rate lower than an etch rate of the dielectric layer under a fluorine-containing etch.

8. The semiconductor structure of claim 3, wherein the second surface, the third surface, and the dielectric layer form a triple point away from the metal gate.

9. The semiconductor structure of claim 8, wherein a separation between the triple point and a sidewall of the metal gate is in a range of from about 30 Å to about 80 Å.

10. The semiconductor structure of claim 3, wherein the third surface comprises a horizontal part at a bottom of the dielectric layer and a vertically oblique part at a sidewall of the dielectric layer.

11. The semiconductor structure of claim 1, wherein the metal gate is positioned on a fin of a FinFET.

12. A semiconductor structure, comprising:
    a substrate; and
    a gate on the substrate, comprising:
        a first portion surrounded by a first etch stop layer; and
        a second portion surrounded by a second etch stop layer and a dielectric layer,
    wherein an interface between the first etch stop layer and the dielectric layer is not in contact with the gate.

13. The semiconductor structure of claim 12, wherein the first etch stop layer, the second etch stop layer and the dielectric layer form a triple point away from the gate.

14. The semiconductor structure of claim 13, wherein a separation between the triple point and a sidewall of the gate is in a range of from about 30 Å to about 80 Å.

15. The semiconductor structure of claim 12, wherein the first etch stop layer and the second etch stop layer comprise materials with an etch rate at least three times slower than an etch rate of the dielectric layer under a fluorine-containing etch.

16. The semiconductor structure of claim 12, further comprising a contact connecting a source or a drain region to an external conductive path, and the contact penetrating the first etch stop layer, the dielectric layer, and the second etch stop layer.

17. The semiconductor structure of claim 12, wherein the gate is an NMOS metal gate or a PMOS metal gate.

18. The semiconductor structure of claim 12, further comprising:
    a first surface between the first portion of the gate and the first etch stop layer; and
    a second surface between the dielectric layer and the first etch stop layer,
    wherein the first surface is higher than the second surface.

19. The semiconductor structure of claim 12, wherein the first etch stop layer comprises a horizontal part at a bottom of the dielectric layer and the second etch stop layer comprises a vertically oblique part at a sidewall of the dielectric layer.

20. The semiconductor structure of claim 12, wherein the gate is positioned on a fin of a FinFET.

* * * * *